United States Patent
Ichinose et al.

(10) Patent No.: US 8,791,466 B2
(45) Date of Patent: Jul. 29, 2014

(54) LIGHT EMITTING ELEMENT AND METHOD OF MAKING SAME

(71) Applicant: Koha Co., Ltd., Tokyo (JP)

(72) Inventors: Noboru Ichinose, Kanagawa-ken (JP); Kiyoshi Shimamura, Chiba-ken (JP); Yukio Kaneko, Tokyo (JP); Encarnacion Antonia Garcia Villora, Tokyo (JP); Kazuo Aoki, Tokyo (JP)

(73) Assignee: Koha Co., Ltd., Tokyo (JP)

( * ) Notice: Subject to any disclaimer, the term of this patent is extended or adjusted under 35 U.S.C. 154(b) by 0 days.

(21) Appl. No.: 13/902,111

(22) Filed: May 24, 2013

(65) Prior Publication Data

US 2013/0248902 A1    Sep. 26, 2013

Related U.S. Application Data

(60) Continuation of application No. 12/604,993, filed on Oct. 23, 2009, now Pat. No. 8,450,747, which is a continuation of application No. 12/134,806, filed on Jun. 6, 2008, now Pat. No. 7,629,615, which is a continuation of application No. 11/982,580, filed on Nov. 2, 2007, now Pat. No. 7,608,472, which is a division of application No. 11/211,860, filed on Aug. 25, 2005, now Pat. No. 7,319,249, which is a continuation of application No. 10/452,158, filed on May 30, 2003, now Pat. No. 6,977,397.

(30) Foreign Application Priority Data

May 31, 2002   (JP) .................................. 2002-160630
May 15, 2003   (JP) .................................. 2003-137912

(51) Int. Cl.
    H01L 29/778    (2006.01)
(52) U.S. Cl.
    USPC ................................. 257/76; 257/103; 257/94
(58) Field of Classification Search
    USPC ............................................... 257/76, 103, 94
    See application file for complete search history.

(56) References Cited

U.S. PATENT DOCUMENTS 5,821,171 A   10/1998   Hong et al.
6,358,770 B2   3/2002   Itoh et al.
(Continued)

FOREIGN PATENT DOCUMENTS

EP   1 306 858 A1   5/2003
JP   07-082088      3/1995
(Continued)

OTHER PUBLICATIONS

Encarnacion Garcia Villora, et al., "Cathodoluminescence of Undoped β-Ga2O3 single crystals", Solid State Communications, 120 (Elsevier Science Ltd.), pp. 455-458 (2001).

(Continued)

Primary Examiner — Long Pham
(74) Attorney, Agent, or Firm — Scully, Scott, Murphy & Presser, P.C.

(57) ABSTRACT

A light emitting element has a substrate of gallium oxides and a pn-junction formed on the substrate. The substrate is of gallium oxides represented by: $(Al_X In_Y Ga_{(1-X-Y)})_2 O_3$ where $0 \leq x \leq 1$, $0 \leq y \leq 1$ and $0 \leq x+y \leq 1$. The pn-junction has first conductivity type substrate, and GaN system compound semiconductor thin film of second conductivity type opposite to the first conductivity type.

4 Claims, 8 Drawing Sheets

(56) References Cited

U.S. PATENT DOCUMENTS

| | | | |
|---|---|---|---|
| 6,639,292 B2 * | 10/2003 | Yagi | 257/440 |
| 6,977,397 B2 | 12/2005 | Ichinose et al. | |
| 7,319,249 B2 | 1/2008 | Ichinose et al. | |
| 7,608,472 B2 | 10/2009 | Ichinose et al. | |
| 2001/0003019 A1 | 6/2001 | Morita | |
| 2003/0024475 A1 | 2/2003 | Anderson | |
| 2003/0107098 A1 | 6/2003 | Ota et al. | |
| 2004/0104392 A1 | 6/2004 | Ishizaki | |

FOREIGN PATENT DOCUMENTS

| | | |
|---|---|---|
| JP | 2000/349336 | 12/2000 |
| JP | 2002/093243 | 3/2002 |
| JP | 2002/134786 A2 | 5/2002 |
| JP | 2003/069076 | 3/2003 |
| JP | 2004/262684 | 9/2004 |
| JP | 2004/269338 | 9/2004 |
| WO | 2004/074556 A3 | 9/2004 |

OTHER PUBLICATIONS

Office Action of Japan Patent Office in Application No. JP 2003-137912, dated Apr. 13, 2005, and English language translation thereof.

Villora, E.G. et al., "Cathodoluminescence of Undoped Beta-Ga2O3 Single Crystals", Solid State Communications, Oxford, GB, vol., 120 (2001), pp. 455-458, XP002981301 ISSN: 0038-1098.

Ueda, N., et al., "Synthesis and Control of Conductivity of Ultraviolet Transmitting Beta-GaO3 Single Crystals", Applied Physics Letters, AIP, American Institute of Physics, Melville, NY, US, vol., 70, No. 26, (Jun. 30, 1997), pp. 3561-3563, XP000694835, ISSN: 0003-6951.

Tomm, Y., et al., "Czochralski Grown Ga2O3 Crystals", Journal of Crsytal Growth, Elsevier, Amsterdam, NL, vol. 220, No. 4, Dec. 2000, pp. 510-514, XP004225848, ISSN: 0022-0248.

Tomm, Y. et al., "Floating Zone Growth of Beta-Ga2O3: A New Window Material for Optoelectronic Device Applications", Solar Energy Materials and Solar Cells, Elsevier Science Publishers, Amsterdam, NL, vol. 66, No. 1-4, Feb. 2001, pp. 369-374, XP004224698, ISSN: 0927-0248.

Wu, et al., "Crystalline Gallium Oxide Nanowires: Intensive Blue Light Emitters", Chemical Physics Letters, vol. 328, (2000), pp. 5-9, XP002473068.

Orita, M., et al., "Preparation of Highly Conductive, Deep Ultraviolet Transparent Beta-Ga2O3 Thin Film at Low Deposition Temperatures", Preparation and Characterization, Elsevier, Sequoia, NL, vol. 411, No. 1, May 22, 2002, pp. 134-139, XP004367243, ISSN: 0040-6090.

U.S. Office Action mailed Nov. 24, 2010 in related U.S. Appl. No. 12/604,993.

U.S. Office Action mailed Apr. 28, 2011 in related U.S. Appl. No. 12/604,993.

* cited by examiner

LIGHT EMITTING ELEMENT AND METHOD OF MAKING SAME

STATEMENT OF RELATED APPLICATIONS

This application is based on Japanese Patent Application Nos. 2003-137912 and 2002-160630, the entire contents of each of which are incorporated herein by reference. Also, the present application is a continuation of currently pending U.S. patent application Ser. No. 12/604,993, filed on Oct. 23, 2009, which is a continuation of U.S. patent application Ser. No. 12/134,806, filed on Jun. 6, 2008, now U.S. Pat. No. 7,629,615, issued Dec. 8, 2009, which is a continuation of U.S. patent application Ser. No. 11/982,580, filed on Nov. 2, 2007, now U.S. Pat. No. 7,608,472, issued Oct. 27, 2009, which is a divisional of U.S. patent application Ser. No. 11/211,860, filed on Aug. 25, 2005, now U.S. Pat. No. 7,319,249, issued Jan. 15, 2008, which is a continuation of U.S. patent application Ser. No. 10/452,158, filed on May 30, 2003, now U.S. Pat. No. 6,977,397, issued Dec. 20, 2005.

BACKGROUND OF THE INVENTION

1. Field of the Invention

This invention relates to a light emitting element with a wide bandgap enough to emit visible light to ultraviolet light and a method of making the same, and relates particularly to a light emitting element employing a colorless, transparent and conductive substrate that transmits emit visible light to ultraviolet light, offering a vertical structure in electrode configuration, and allowing emitted light to be outputted from the substrate side and a method of making the same.

2. Description of the Related Art

Conventionally, a light emitting element with a composition of SiC substrate/n-GaN/p-GaN is known (e.g., Japanese patent application laid-open No. 2002-255692).

SiC is brown and transparent material, and it transmits visible light up to about 427 nm. Therefore, a light emitting element employing the SiC substrate allows emitted light to be outputted from the substrate side.

The light emitting element employing a SiC substrate is manufactured by epitaxially growing SiC thin film on a SiC single crystal wafer to get the SiC substrate, then growing n-GaN and p-GaN layers on the substrate, cutting out light emitting element chips.

However, there is a serious problem in the light emitting element employing the SiC substrate. The SiC single crystal wafer has a bad crystalline quality such that there exist micro-pipe defects penetrating vertically in the SiC single crystal wafer. Therefore, it is required that, when making chips from a wafer having n-GaN and p-GaN layers grown thereon, the wafer must be carefully cut while avoiding the micro-pipe defect. This causes a bad efficiency in the manufacture of light emitting element.

On the other hand, SiC transmits up to light of blue region but does not transmit light of ultraviolet region. When GaN-emitted light including visible light to ultraviolet light is outputted from the substrate side, the light of ultraviolet region cannot be transmitted therethrough. Thus, ultraviolet light cannot be outputted from the substrate side. Furthermore, SiC is brown-colored and, therefore, when transmitting light through SiC, part of emitted light wavelength must be absorbed.

SUMMARY OF THE INVENTION

It is an object of the invention to provide a light emitting element that employs a colorless, transparent and conductive substrate that transmits emit visible light to ultraviolet light, offers a vertical structure in electrode configuration, and allows emitted light to be outputted from the substrate side and a method of making the same.

It is another object of the invention to provide a light emitting element with a good manufacturing efficiency and a method of making the same.

According to the invention, a light emitting element comprises:

a substrate of gallium oxides; and a pn-junction formed on the substrate.

According to another aspect of the invention, a light emitting element comprises:

a single crystal substrate of oxides including gallium as the major component; and compound semiconductor thin film formed on the single crystal substrate.

According to a further aspect of the invention, a method of making a light emitting element, comprises the steps of:

growing a single crystal substrate including gallium as the major component by EFG (Edge-defined film Fed Growth) method where, in a high-temperature vessel of a controlled atmosphere, using a slit die that allows source material melt to be continually lifted above the slit die through the capillary phenomenon of a slit provided with the slit die and a crucible that accommodates the slit die and the source material melt, single crystal the cross section of which has the same shape as the top surface of the slit die is grown; and growing compound semiconductor thin film on the substrate.

According to a further aspect of the invention, a method of making a light emitting element, comprises the steps of:

providing single crystalline $Ga_2O_3$ system seed crystal and non-single crystalline $Ga_2O_3$ system material;

growing a single crystal substrate including gallium as the major component by FZ (Floating Zone) method where the $Ga_2O_3$ system seed crystal and $Ga_2O_3$ system material are contacted and heated such that the $Ga_2O_3$ system seed crystal and $Ga_2O_3$ system material are melted at the contacting portion, thereby crystallize the $Ga_2O_3$ system material; and growing compound semiconductor thin film on the substrate.

BRIEF DESCRIPTION OF THE DRAWINGS

Preferred embodiments of the invention will be explained with reference to the drawings, wherein.

DETAILED DESCRIPTION OF THE PREFERRED EMBODIMENTS

[Substrate]

β-$Ga_2O_3$ substrate is conductive and, therefore, a vertical-type LED in electrode configuration can be made. As a result, the entire light emitting element of the invention forms a current flowing path and, thereby, the current density can be lowered and the life of the light emitting element can be elongated.

Figure 1:
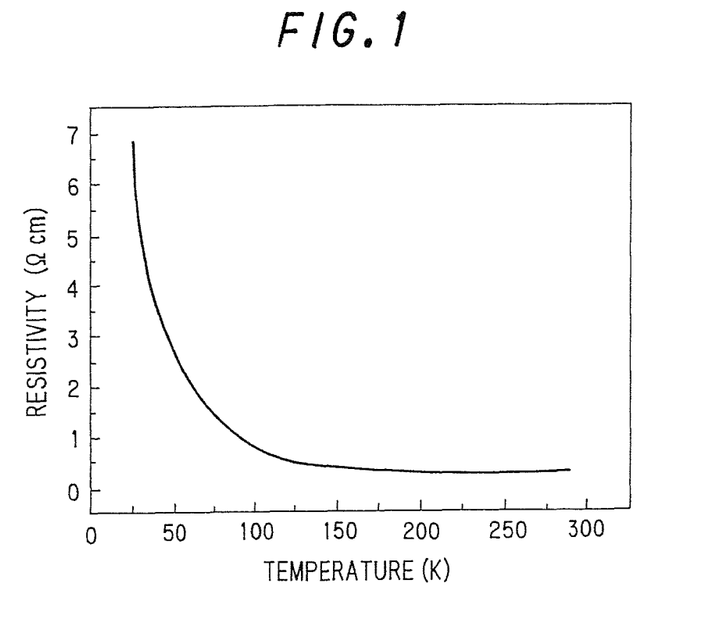
FIG. 1 is a graph showing a temperature dependency of resistivity of $\beta$-$Ga_2O_3$.

FIG. 1 shows resistivity measurements of β-$Ga_2O_3$ substrate. Measuring the resistivity of β-$Ga_2O_3$ substrate with n-type conductivity, as shown in FIG. 1, a resistivity of about 0.1 Ωcm is obtained at room temperature. Furthermore, the temperature dependency of resistivity is small in the temperature range where the light emitting element will be exactly used. Therefore, the light emitting element using the β-$Ga_2O_3$ substrate has an excellent stability.

Due to offering the vertical-type LED in electrode configuration, the step of etching its n-layer to expose to form an n-electrode thereon is not needed. Therefore, the number of manufacturing steps can be decreased and the number of chips obtained per unit area of substrate can be increased. The manufacturing cost could be lowered.

In contrast, when a sapphire substrate is used, the electrode configuration must be horizontal. In this case, after thin layers of III-V compound semiconductor such as GaN is grown, the step of etching and masking the n-layer to expose to form an n-electrode thereon is additionally needed to install the n-electrode. Comparing with this, when the electrode configuration is vertical as the case of GaAs system light emitting elements, the steps of etching and masking the n-layer is not needed.

When a SiC substrate is used, the lattice mismatch between SiC and GaN is substantially large. In case of SiC, multiple phases of 3C, 4H, 6H, 15R etc. exist and, therefore, it is difficult to obtain a substrate in a single phase. Also, due to the very high hardness, the processability is not good and it is difficult to get a smooth substrate. Observing it in atom scale, there exist a lot of steps with different phases on the surface of substrate. When a thin layer is grown on such a SiC substrate, it must have multiple crystalline types and different defect densities. Namely, in growing the thin layer on the SiC substrate, a number of cores with different crystalline qualities are first grown on the substrate and then the thin layer is grown such that the cores are combined. Therefore, it is extremely difficult to improve the crystalline quality of the thin layer. The lattice mismatch between SiC and GaN is reported theoretically 3.4%, but it is, in fact, considerably greater than that value due to the above reasons.

In comparison with SiC, β-$Ga_2O_3$ is of a single phase and has a smooth surface in atom scale. Therefore, β-$Ga_2O_3$ does not have such a substantially large lattice mismatch as observed in SiC. From the viewpoint of bandgap, SiC, e.g., 6H—SiC has a bandgap of 3.03 eV and is not transparent in the wavelength range of shorter than about 427 nm. Considering that the entire light emission range of III-V system compound semiconductors is about 550 to 380 nm, the available wavelength range of SiC is only about two thirds of the entire range. In contrast, β-$Ga_2O_3$ is transparent in the range of longer than about 260 nm, which covers the entire light emission range of III-V system compound semiconductors, and is available particularly in ultraviolet region.

The substrate applicable to the invention, though it is basically of β-$Ga_2O_3$, may be of an oxide that includes Ga (gallium) as the major component and, as the minor component, at least one selected from the group of Cu, Ag, Zn, Cd, Al, In, Si, Ge and Sn. The minor component functions to control the lattice constant or bandgap energy. For example, the substrate may be $(Al_SIn_YGa_{(1-X-Y)})_2O_3$, where $0 \leq x \leq 1$, $0 \leq y \leq 1$, and $0 \leq x+y \leq 1$.

[Thermal Expansion Coefficient]

From the viewpoint of thermal expansion, comparing GaN having a thermal expansion coefficient of $5.6 \times 10^{-6}$/K, β-$Ga_2O_3$ has that of $4.6 \times 10^{-6}$/K, which is nearly equal to sapphire ($4.5 \times 10^{-6}$/K) and more advantageous than 6H—SiC ($3.5 \times 10^{-6}$/K). Thus, to reduce the difference of thermal expansion coefficients therebetween is a key factor in enhancing the quality of grown film.

[Bulk Single Crystal]

The most advantageous point of β-$Ga_2O_3$ is that it can give a bulk single crystal. In the light emission region of near-infrared to red obtained from, typically, GaAs system material, a bulk single crystal is always available and it allows a thin layer having an extremely small lattice mismatch to the substrate to be grown on the conductive substrate. Therefore, it is easy to make a light emitting element with low cost and high light emission efficiency.

In contrast, for GaN system and ZnSe system materials expected to give a blue LED, it is, in fact, impossible to give a bulk single crystal. In the filed of these material systems, it has been a great deal tried to make a bulk single crystal that is conductive and transparent in the light emission region and that has a sufficiently small lattice mismatch. However, even now, this problem is not solved. The β-$Ga_2O_3$ substrate of the invention can perfectly solve the problem. The invention enables the manufacture of the bulk single crystal with a diameter of 2 inches by EFZ method or FZ method and, thereby, the blue to ultraviolet LEDs can be developed in the same way as GaAs system LED.

[Manufacture of $Ga_2O_3$ Single Crystal by EFG Method]

Figure 2:
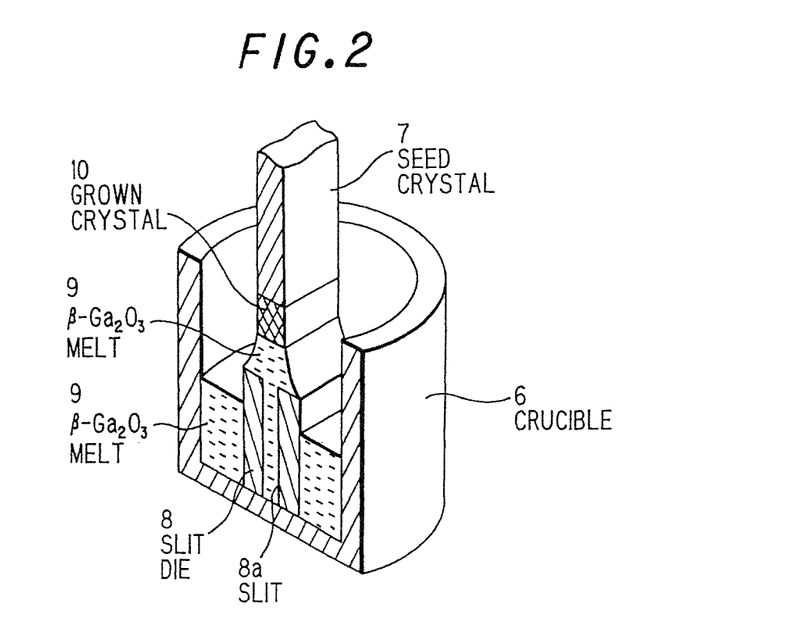
FIG. 2 is a partly cross sectional and perspective view showing a crucible 6 to be inserted into FEG pulling vessel used in a method of making a light emitting element according to the invention.

FIG. 2 shows a crucible that is used to manufacture a $Ga_2O_3$ single crystal by EFG method. The crucible 6 is used being inserted to an EFG pulling vessel (not shown). The crucible 6 is of, e.g., iridium and is provided with a slit die 8 having a slit 8a through the capillary phenomenon of which β-$Ga_2O_3$ melt 9 is lifted.

The growth of single crystal by EFG method is performed as follows. β-$Ga_2O_3$ as raw material is entered a predetermined amount into the crucible 6, being heated to melt, and, thereby, β-$Ga_2O_3$ melt 9 is obtained. β-$Ga_2O_3$ melt 9 is lifted above the slit die 8 provided in the crucible 6 through the capillary phenomenon of the slit 8a to contact a seed crystal 7. Being cooled, a grown crystal 10 having an arbitrary sectional form is obtained.

In detail, the crucible 6 of iridium has an inner diameter of 48.5 mm, a thickness of 1.5 mm, and a height of 50 mm. Into the crucible 6, $Ga_2O_3$ of 75 g as raw material is entered. Then, the slit die 8 which is 3 mm thick, 20 mm wide, 40 mm high and 0.5 mm slit interval is set in the crucible 6. The crucible 6 is kept 1,760° C. in ordinary atmosphere of nitrogen and at oxygen partial pressure of $5 \times 10^{-2}$ under 1 atm, the seed crystal 7 of β-$Ga_2O_3$ is contacted to the β-$Ga_2O_3$ melt 9 being lifted through the capillary phenomenon of the slit 8a. The growth speed of single crystal is 1 mm/h.

The single crystal is grown on the slit die 8 while being defined by the shape of the slit die 8 and, therefore, the thermal gradient at the crystal growing interface is considerably smaller than CZ method. Further, β-$Ga_2O_3$ melt 9 is supplied through the slit 8a and the crystal growth speed is higher than the diffusion speed of β-$Ga_2O_3$ melt 9 in the slit 8a. Therefore, the evaporation of components included in β-$Ga_2O_3$ melt 9, i.e., a variation in composition of β-$Ga_2O_3$ melt 9 can be effectively suppressed. As a result, a high-quality single crystal can be obtained. Also, to increase the size of single crystal can be easily achieved by increasing the slit die 8 because the shape of grown crystal 10 is defined by the shape of the slit die 8. Thus, EFG method offers the increased size and high quality of $Ga_2O_3$ single crystal, which were hard to achieve by CZ method.

[Manufacture of $Ga_2O_3$ Single Crystal by FZ Method]

Figure 3:
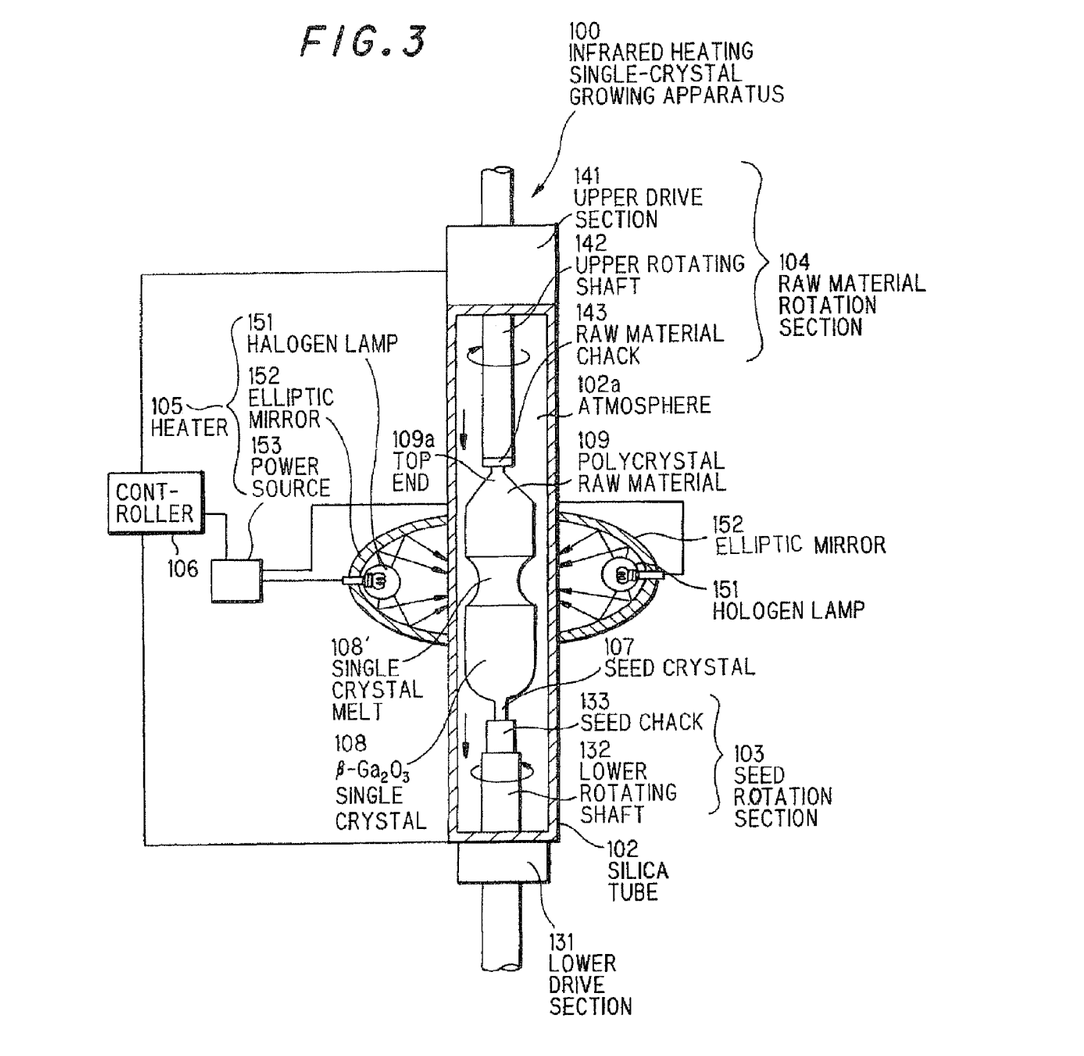
FIG. 3 is a partly cross sectional view showing an infrared heating single-crystal growing apparatus used in a method of making a light emitting element according to the invention.

FIG. 3 shows an infrared heating single-crystal growing apparatus that is used to manufacture a $Ga_2O_3$ single crystal by FZ(Floating Zone) method. The infrared heating single-crystal growing apparatus 100 includes: a silica tube 102; a seed rotation section 103 that holds and rotates a seed crystal 107 of β-$Ga_2O_3$ (hereinafter referred to as "seed crystal 107"); a raw-material rotation section 104 that holds and rotates a polycrystalline raw material 109 of β-$Ga_2O_3$ (hereinafter referred to as "polycrystalline raw material 109"); a heater 105 that heats the polycrystalline raw material 109 to melt it; and a controller 106 that controls the seed rotation section 103, raw-material rotation section 104 and the heater 105.

The seed rotation section 103 includes: a seed chack 133 that holds the seed crystal 107; a lower rotating shaft 132 that rotates the seed chack 133; and a lower drive section that drives the lower rotating shaft 132 to rotate clockwise and move upward and downward.

The raw-material rotation section 104 includes: a raw-material chack 143 that holds the top end 109a of polycrystalline raw material 109; an upper rotating shaft 142 that rotates the raw-material chack 143; and an upper drive section 141 that drives the upper rotating shaft 142 to rotate counterclockwise and move upward and downward.

The heater 105 includes: a halogen lamp 151 that heats the polycrystalline raw material 109 from the diameter direction to melt it; an elliptic minor 152 that accommodates the halogen lamp 151 and converges light radiated from the halogen lamp 151 to a predetermined portion of the polycrystalline raw material 109; and a power source 153 that supplies power to the halogen lamp 151.

The silica tube 102 accommodates the lower rotating shaft 132, the seed chack 133, the upper rotating shaft 142, the polycrystalline raw material 109, a single crystal 108 of β-$Ga_2O_3$ and the seed crystal 107. The silica tube 102 is structured such that mixed gas of oxygen gas and nitrogen gas as inert gas can be supplied and sealed therein.

The growth of β-$Ga_2O_3$ single crystal is performed as follows. First of all, the seed crystal 107 and polycrystalline raw material 109 are prepared. The seed crystal 107 is obtained, e.g., by cutting out β-$Ga_2O_3$ along the cleaved surface. It has a diameter of less than one fifth of that of grown crystal or a sectional area of less than 5 $mm^2$ and has such a strength that it does not break when growing the β-$Ga_2O_3$ single crystal. The polycrystalline raw material 109 is obtained by charging a predetermined amount of $Ga_2O_3$ powder into a rubber tube (not shown), cold-compressing it at 500 MPa, then sintering it at 1500° C. for ten hours.

Then, the end of the seed crystal 107 is fixed to the seed chack 133, and the top end 109a of polycrystalline raw material 109 is fixed to the raw-material chack 143. The top end of the seed crystal 107 is contacted to the bottom end of the polycrystalline raw material 109 by controlling upward and downward the position of the upper rotating shaft 142. The positions of upper rotating shaft 142 and the lower rotating shaft 132 are controlled upward and downward such that light of the halogen lamp 151 is converged on the top end of the seed crystal 107 and the bottom end of the polycrystalline raw material 109. The atmosphere 102a in the silica tube 102 is filled with mixed gas of nitrogen and oxygen, the composition of which may vary between 100% nitrogen and 100% oxygen, at a total pressure of 1 to 2 atm.

When an operator turns on a power switch(not shown), the controller 106 starts the single crystal growth control to the respective sections according to a control program as follows. Turning on the heater 105, the halogen lamp 151 starts heating the top end of the seed crystal 107 and the bottom end of the polycrystalline raw material 109, melting their contacting portions to make a melt drop. In this stage, only the seed crystal 107 is kept rotating.

Then, the seed crystal 107 and the polycrystalline raw material 109 are rotated in the opposite direction to each other such that their contacting portions are melted while being sufficiently mixed together. When a suitable amount of single crystal melt 108' of β-$Ga_2O_3$ is obtained, the polycrystalline raw material 109 stops rotating and only the seed crystal 107 keeps rotating, and then the polycrystalline raw material 109 and the seed crystal 107 are pulled in the opposite direction to each other, i.e., upward and downward respectively to form a dash-neck which is thinner than the seed crystal 107.

Then, the seed crystal 107 and the polycrystalline raw material 109 are heated by the halogen lamp 151 while being rotating at 20 rpm in the opposite direction to each other, and the polycrystalline raw material 109 is pulled upward at a rate of 5 mm/h by the upper rotating shaft 142. In heating the polycrystalline raw material 109, the polycrystalline raw material 109 is melt to form the single crystal melt 108', which is then cooled to grow β-$Ga_2O_3$ single crystal 108 that has a diameter of the same as or less than the polycrystalline raw material 109. When a suitable length of single crystal is grown, the β-$Ga_2O_3$ single crystal 108 is extracted.

Next, the manufacture of substrate using β-$Ga_2O_3$ single crystal 108 is conducted as follows. β-$Ga_2O_3$ single crystal 108 has a strong cleavage at (100) face when it is grown in b-axis <010> orientation and is, therefore, cleaved at planes parallel and vertical to (100) face to get a substrate. Alternatively, when it is grown in a-axis <100> orientation or c-axis <001> orientation, the cleavage at (100) or (001) face becomes weak and, therefore, the processability at all planes becomes good and there is no limitation about the cleaved surface.

Advantages in the manufacture of β-$Ga_2O_3$ single crystal 108 by FZ method are as follows.

(1) Large sized β-$Ga_2O_3$ single crystal 108 having a diameter of more than 1 cm can be obtained since it is grown in a predetermined direction.

(2) High crystalline quality can be obtained while suppressing the cracking and eutectic crystallization when β-$Ga_2O_3$ single crystal 108 is grown in a-axis <100>, b-axis <010> or c-axis <001> orientation.

(3) β-$Ga_2O_3$ single crystal 108 can be produced in good reproducibility and can be, therefore, applied to as a substrate for various semiconductor devices.

[Growth of II-VI Group Compound ZnSe Thin Film on β-$Ga_2O_3$ Substrate]

On (101) face of β-$Ga_2O_3$ system single crystal substrate, ZnSe thin film with p-type conductivity is grown at 350° C. by MOCVD (metal organic chemical vapor deposition). Source gases for ZnSe are Dimethyl zinc and H2Se. Nitrogen as p-dopant is supplied by preparing NH3 atmosphere. Nitrogen is, as acceptor, doped while being substituted for Se. II group element may be Zn, Cd and Hg, and IV group element may be O, S, Se, Te and Po. II-VI system compound applicable to the invention is, for example, ZnSe, ZnO etc.

[Growth of III-V Group Compound Thin Film on $\beta$-Ga$_2$O$_3$ Substrate]

III-V group compound thin film is grown by MOCVD. III group element may be B, Al, Ga, In and Tl, and V group element may be N, P, As, Sb and Bi. III-V system compound applicable to the invention is, for example, GaN, GaAs etc.

Figure 4:
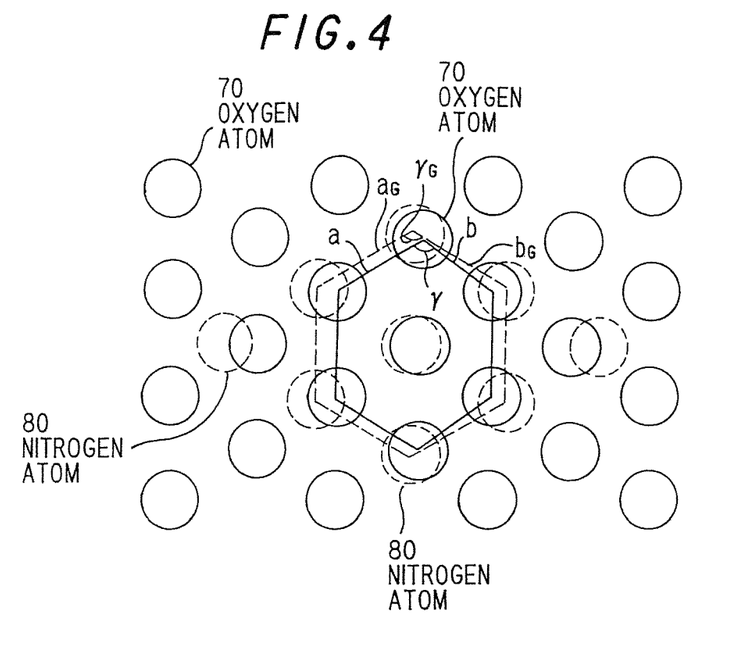
FIG. 4 shows an atom arrangement in the case that GaN (001) face thin film is grown on (101) face of $\beta$-$Ga_2O_3$ system single crystal substrate.

FIG. 4 shows an atomic arrangement in the case that GaN thin film is grown on (101) face of $\beta$-Ga$_2$O$_3$ system single crystal substrate. In this case, (001) face of GaN is grown on (100) face of $\beta$-Ga$_2$O$_3$ system single crystal. O atoms 70, 70, . . . are arranged on (101) face of $\beta$-Ga$_2$O$_3$ system single crystal. In FIG. 4, oxygen (O) atoms 70 are represented by solid-line circle. The lattice constant of $\beta$-Ga$_2$O$_3$ system single crystal in (101) face is a=b=0.289 nm, $\gamma \approx 116°$. The lattice constant of GaN in (001) face is $a_G=b_G=0.319$ nm, $\gamma_G=120°$. In FIG. 4, nitrogen (N) atoms 80 are represented by dot-line circle.

When GaN thin film is formed such that (001) face of GaN is grown on (101) face of $\beta$-Ga$_2$O$_3$ system single crystal, the mismatch of lattice constant is about 10%, and the mismatch of angle is about 3%. Thus, the arrangement of oxygen atoms of $\beta$-Ga$_2$O$_3$ system single crystal is nearly identical to that of nitrogen atoms of GaN, and, therefore, GaN thin film can have a uniform plane structure. Even when GaN thin film is formed on (101) face of $\beta$-Ga$_2$O$_3$ system single crystal without a buffer layer to be inserted therebetween, there is no problem about lattice mismatch.

Alternatively, when In is added to $\beta$-Ga$_2$O$_3$ single crystal to adjust the lattice constant, the lattice constant of GaN in (001) face becomes closer to that of $\beta$-Ga$_2$O$_3$ system single crystal in (101) face. Therefore, GaN thin film can have a more uniform plane structure.

Figure 5:
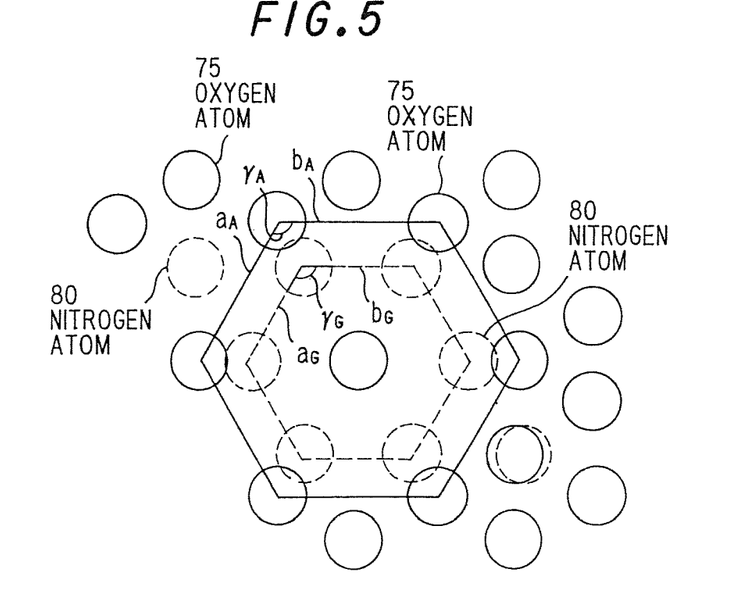
FIG. 5 shows an atom arrangement in the case that GaN (001) face thin film is grown on (001) face of $Al_2O_3$ system crystal substrate.

FIG. 5 shows an atomic arrangement in the case that GaN thin film is grown on Al$_2$O$_3$ system crystal substrate. O atoms 75, 75, . . . are arranged on (001) face of Al$_2$O$_3$ system crystal. In FIG. 5, oxygen (O) atoms 75 are represented by solid-line circle. The lattice constant of Al$_2$O$_3$ system crystal in (001) face is $a_A=b_A=0.475$ nm, $\gamma_A=120°$. The lattice constant of GaN in (001) face is $a_G=b_G=0.319$ nm, $\gamma_G=120°$. In FIG. 5, nitrogen (N) atoms 80 are represented by dot-line circle.

When GaN thin film is formed such that (001) face of GaN is grown on (001) face of Al$_2$O$_3$ system crystal, the mismatch of lattice constant is about 30%. Therefore, when GaN thin film is formed on Al$_2$O$_3$ system crystal without a buffer layer to be inserted therebetween, there occurs a problem that due to the lattice mismatch therebetween GaN thin film may have no uniform plane structure.

[Method of Growing Thin Film on $\beta$-Ga$_2$O$_3$ Substrate]

Figure 6:
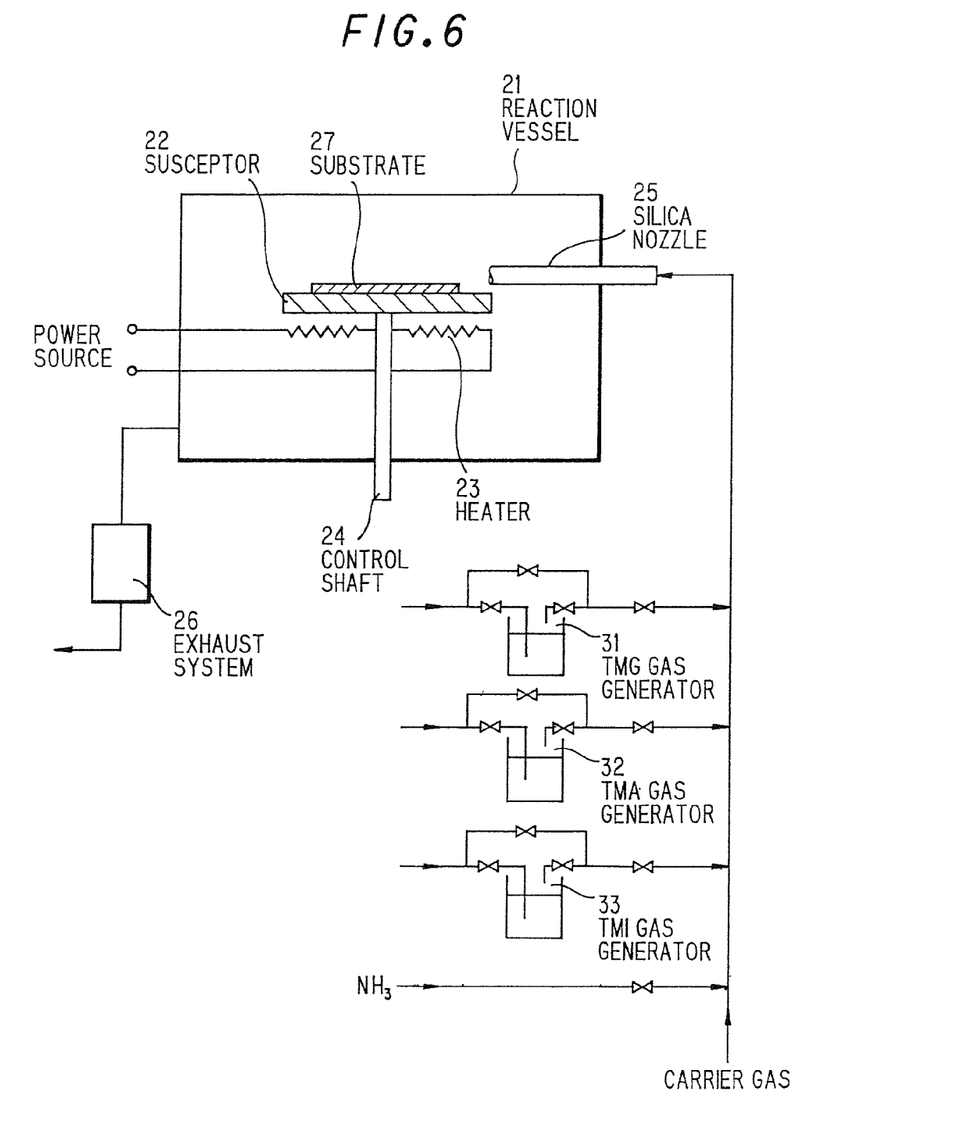
FIG. 6 is an illustration showing an MOCVD apparatus used in a method of making a light emitting element according to the invention.

FIG. 6 schematically shows a MOCVD apparatus. The MOCVD apparatus 20 includes: a reaction vessel 21 equipped with an exhaust system 26 that includes a vacuum pump and an exhauster (not shown); a susceptor 22 on which a substrate 27 is mounted; a heater 23 to heat the susceptor 22; a control shaft that rotates and moves upward and downward the susceptor 22; a silica nozzle 25 that supplies source gases in the oblique or horizontal direction to the substrate; a TMG gas generator 31 that generates trimethyl gallium (TMG) gas; a TMA gas generator 32 that generates trimethyl aluminum (TMA) gas; and a TMI gas generator 33 that generates trimethyl indium (TMI) gas. If necessary, the number of gas generators may be increased or decreased. Nitrogen source is NH$_3$ and carrier gas is H$_2$. When growing GaN thin film, TMG and NH$_3$ are used. When growing AlGaN thin film, TMA, TMG and NH$_3$ are used. When growing InGaN thin film, TMI, TMG and NH$_3$ are used.

Figure 7:
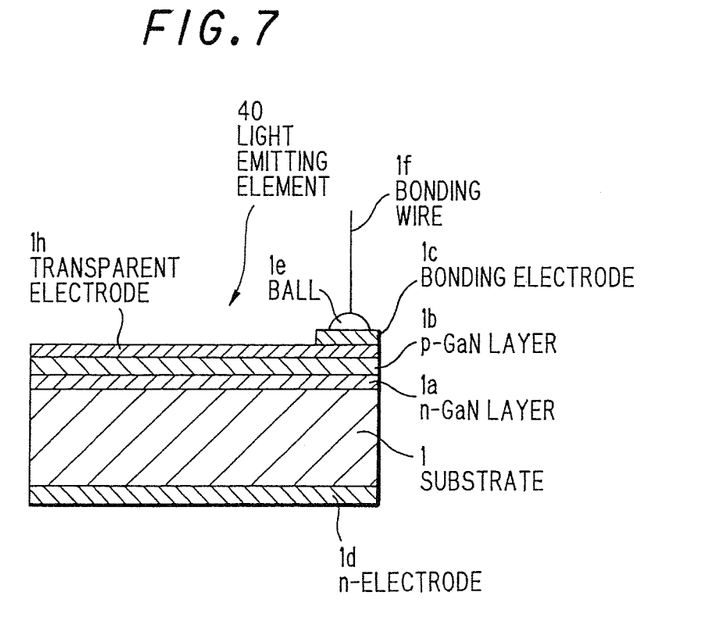
FIG. 7 is a cross sectional view showing a first example of light emitting element according to the invention.

FIG. 7 shows the cross sectional structure of a light emitting element 40 including semiconductor layers grown by the MOCVD apparatus 20 in FIG. 6.

The process of growing the semiconductor layers by the MOCVD apparatus 20 is as follows. First of all, the substrate 27 is mounted on the susceptor 22 while facing up the film-forming surface, and then it is set into the reaction vessel. At a temperature of 1020° C., TMG of $54 \times 10^{-6}$ mol/min, NH$_3$ of 4 l/min, H$_2$ of 2 l/min and monosilane (SiH$_4$) of $2 \times 10^{-11}$ mol/min are flown for 60 min, thereby 3 μm thick Si-doped GaN (n-GaN) layer 1a is grown.

Then, at a temperature of 1030° C., TMG of $54 \times 10^{-6}$ mol/min, NH$_3$ of 4 l/min, H$_2$ of 2 l/min and biscyclopentadienyl magnesium (CP$_2$Mg) of $3.6 \times 10^{-6}$ mol/min are flown for 20 min, thereby 1 μm thick Mg-doped GaN (p-GaN) layer 1b is grown. On the layer 1b, transparent electrode (Au/Ni) 1h is deposited and then Mg-doped GaN 1b is made p-type by annealing. A bonding electrode (p-electrode) 1c is formed on the transparent electrode 1h, and a bonding wire 1f is bonded to the bonding electrode 1c while forming a ball 1e. Then, an n-electrode 1d is formed on the bottom surface of the substrate 27. Thus, the light emitting element 40 is obtained.

The electrodes are formed by deposition or sputtering etc. They are of materials that offer ohmic contact to the layer or substrate on which the electrodes are formed. For example, to n-type conductivity layer or substrate, any one of metals including Au, Al, Co, Ge, Ti, Sn, In, Ni, Pt, W, Mo, Cr, Cu, and Pb, or an alloy including two or more of the metals (e.g., Au—Ge alloy), or two-layer structure selected from the metals (e.g., Al/Ti, Au/Ni and Au/Co), or ITO (indium tin oxide) is used. To p-type conductivity layer or substrate, any one of metals including Au, Al, Be, Ni, Pt, In, Sn, Cr, Ti and Zn, or an alloy including two or more of the metals (e.g., Au—Zn alloy and Au—Be alloy), or two-layer structure selected from the metals (e.g., Ni/Au), or ITO is used.

[Forming of Thin Layers with Different Carrier Concentrations]

For example, on n-GaN layer, another n-GaN layer with a carrier concentration lower than the n-GaN layer is formed, and, on the lower carrier concentration n-GaN layer, p-GaN layer and another p-GaN layer with a carrier concentration higher than the p-GaN layer are formed in that order. The carrier concentration can be differentiated by changing the amount of n-dopant or p-dopant added.

When using the substrate of $\beta$-Ga$_2$O$_3$ system single crystal and forming, on the substrate, a plurality of n-type layers with different carrier concentrations and a plurality of p-type layers with different carrier concentrations, advantages (1) to (4) stated below are obtained.

(1) Due to a carrier concentration lower than the substrate, the n-GaN layer grown on the substrate has a good crystalline quality and thereby the light emission efficiency is enhanced.

(2) Due to the junction of n-GaN layer and p-GaN layer, the light emitting element having pn-junction is formed and therefore the light emission of a short wavelength is obtained through the bandgap of GaN.

(3) Due to being of $\beta$-Ga$_2$O$_3$ system single crystal, the substrate can enjoy a high crystalline quality and n-type good conductivity.

(4) Due to being of $\beta$-Ga$_2$O$_3$ system single crystal, the substrate can transmit light of ultraviolet region and therefore ultraviolet light to visible light can be emitted from the substrate side.

[Forming of Buffer Layer]

Figure 8:
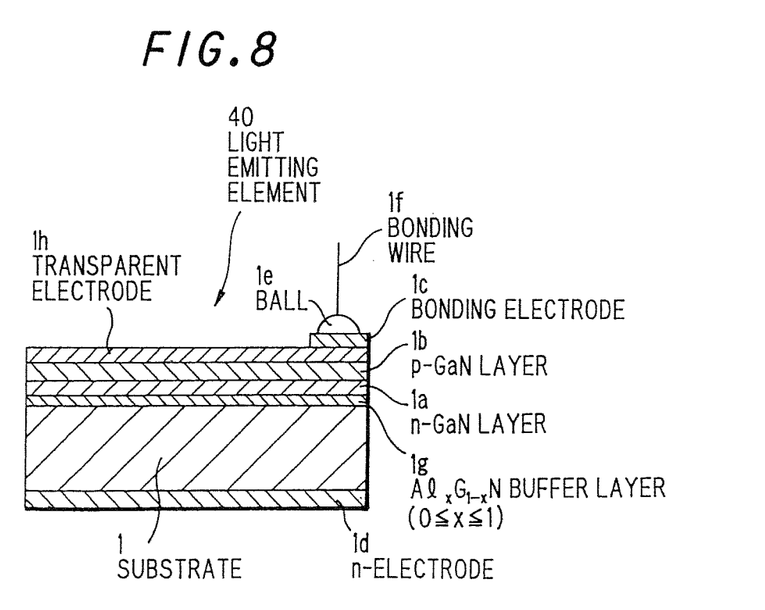
FIG. 8 is a cross sectional view showing a modification of the first example in FIG. 7.

FIG. 8 shows a modification that the light emitting element in FIG. 7 further includes a buffer layer. Between $\beta$-Ga$_2$O$_3$ single crystal substrate 27 of the invention and n-GaN layer 1a, there is formed a $Al_xGa_{1-x}N$ buffer layer ($0\leq x\leq 1$). The buffer layer is grown by the above-mentioned MOCVD apparatus. The p-n junction structure is grown by the above-mentioned method of growing thin film on $\beta$-$Ga_2O_3$ substrate.

Examples of this invention are stated below.

EXAMPLE 1

Forming of n-GaN Thin Film on p-Type Conductivity Substrate

The p-type conductivity substrate is made as follows. First, $\beta$-$Ga_2O_3$ single crystal is prepared by FZ method. The $\beta$-$Ga_2O_3$ polycrystalline raw material is obtained by uniformly mixing, for example, $\beta$-$Ga_2O_3$ including MgO (p-dopant source) and charging a predetermined amount of the mixture into a rubber tube, cold-compressing it at 500 MPa to form a stick, then sintering it at 1500° C. for ten hours in the atmosphere. Thereby, $\beta$-$Ga_2O_3$ system polycrystalline raw material including Mg is obtained. By another way, $\beta$-$Ga_2O_3$ seed crystal is provided. Under the growth atmosphere with total pressure of 1 to 2 atm, flowing mixture gas of $N_2$ and $O_2$ at 500 ml/min, the $\beta$-$Ga_2O_3$ seed crystal and $\beta$-$Ga_2O_3$ system polycrystalline raw material are contacted to each other in the silica tube, and they are heated such that the $\beta$-$Ga_2O_3$ seed crystal and $\beta$-$Ga_2O_3$ system polycrystalline raw material are melted at the contacting portion. The melting $\beta$-$Ga_2O_3$ seed crystal and $\beta$-$Ga_2O_3$ system polycrystalline raw material are rotated at 20 rpm in the opposite direction to each other, and $\beta$-$Ga_2O_3$ single crystal is grown at a rate of 5 mm/h during the rotation. As a result, on the $\beta$-$Ga_2O_3$ seed crystal, transparent and insulating $\beta$-$Ga_2O_3$ system single crystal including Mg is obtained. The $\beta$-$Ga_2O_3$ system single crystal is used as the substrate. The substrate is then annealed at a predetermined temperature (e.g., 950° C.) in oxygen atmosphere for a period and, thereby, the number of oxygen defects is decreased to give the p-type conductivity substrate.

Then, the n-type conductivity thin film is formed on the substrate obtained. The thin film is grown by MOCVD method. First, the p-type conductivity substrate is set into the MOCVD apparatus. Keeping the substrate temperature at 1150° C., $H_2$ of 20 l/min, $NH_3$ of 10 l/min, TMG of $1.7\times10^{-4}$ mol/min and monosilane ($SiH_4$) diluted to 0.86 ppm by $H_2$ of 200 ml/min are flown for 30 min. Thereby, about 2.2 µm thick n-type conductivity GaN thin film with a carrier concentration of $1.5\times10^{18}/cm^3$ is formed.

EXAMPLE 2

Light Emitting Element with pn-Junction

Figure 9:
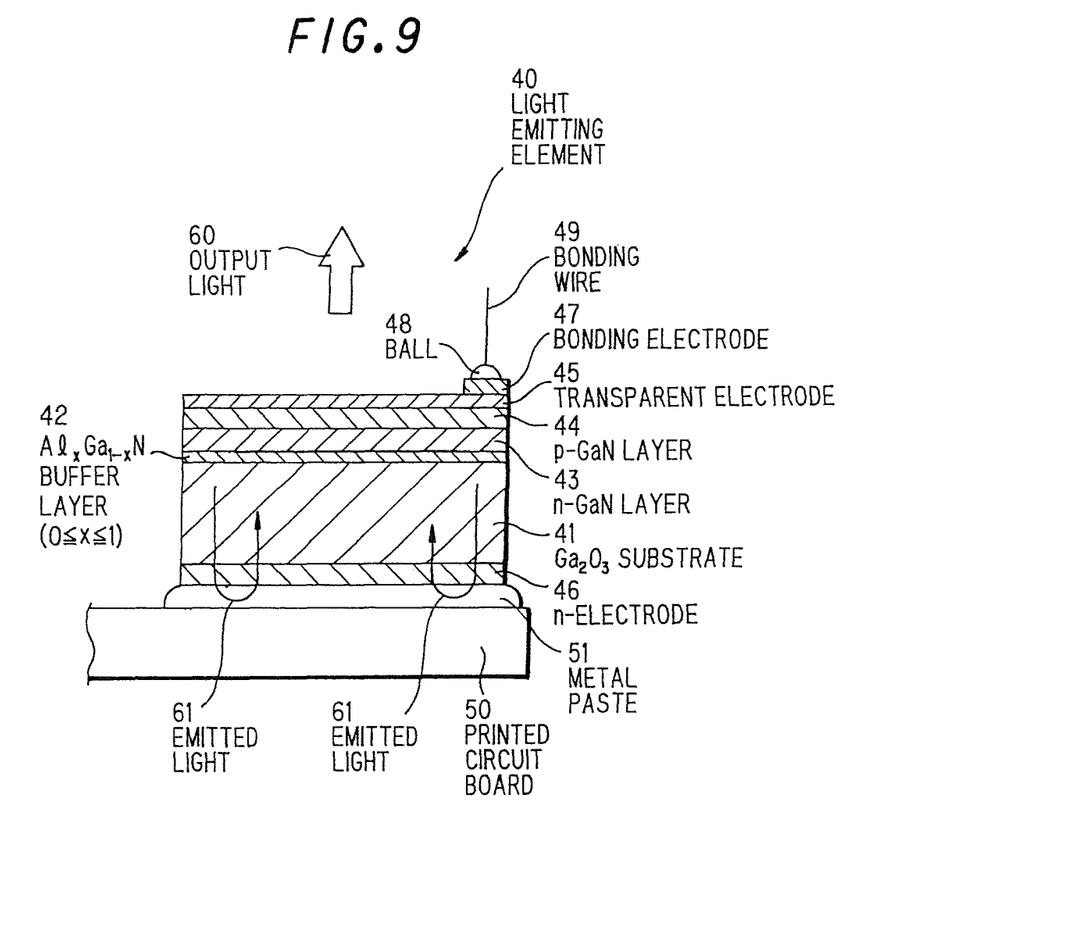
FIG. 9 is a cross sectional view showing a second example of light emitting element according to the invention.

FIG. 9 shows a light emitting element with pn-junction mounted on a printed circuit board. The light emitting element 40 includes: a $Ga_2O_3$ substrate 41 of $\beta$-$Ga_2O_3$ single crystal; a $Al_xGa_{1-x}N$ buffer layer 42 ($0\leq x\leq 1$) formed on the $Ga_2O_3$ substrate 41; a n-GaN layer 43 formed on the $Al_xGa_{1-x}N$ buffer layer 42; a p-GaN layer 44 formed on the n-GaN layer 43; a transparent electrode 45 formed on the p-GaN layer 44; a Au bonding electrode 47 formed on part of the transparent electrode 45; and a n-electrode 46 formed on the bottom surface of the $Ga_2O_3$ substrate 41. The light emitting element 40 is mounted on the printed circuit board 50 through a metal paste 51 and a bonding wire 49 is bonded to the bonding electrode 47 while forming a ball 48.

The light emitting element 40 emits light at the pn-junction interface where the n-GaN layer 43 and p-GaN layer 44 are bonded. Emitted light is output such that part of emitted light is output, as output light 60, upward through the transparent electrode 45 and another part is first directed to the bottom of the $Ga_2O_3$ substrate 41, transmitting through the substrate 41, then being outputted upward after being reflected by the metal paste 51. Thus, the light emission intensity of is increased comparing the case that emitted light is directly output.

EXAMPLE 3

Flip-Chip Type Light Emitting Element

Figure 10:
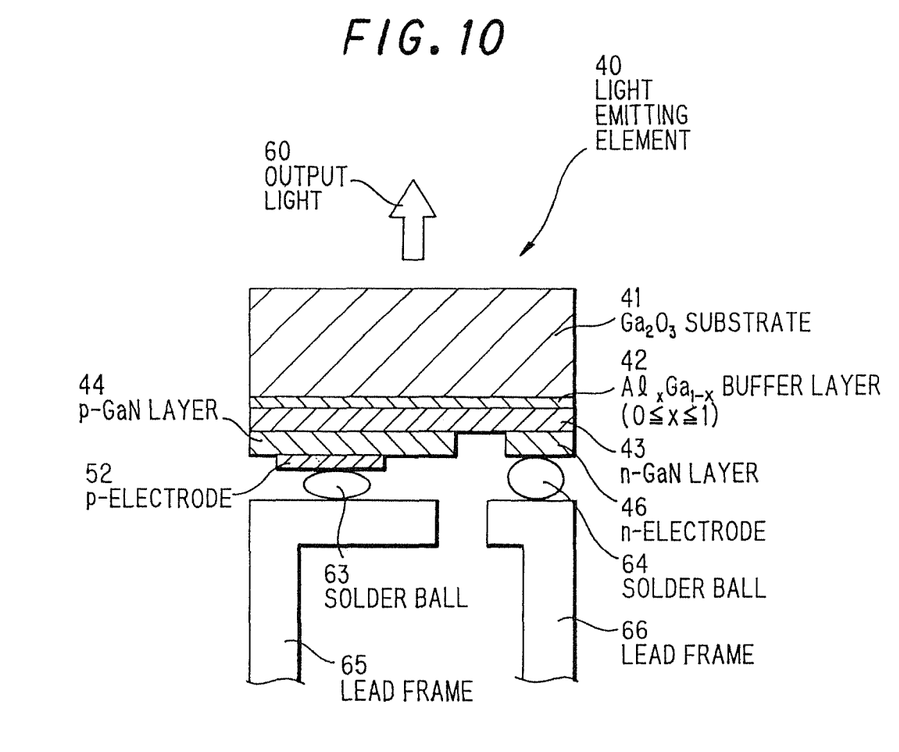
FIG. 10 is a cross sectional view showing a third example of light emitting element according to the invention.

FIG. 10 shows a flip-chip type light emitting element. The light emitting element 40 includes: a $Ga_2O_3$ substrate 41 of $\beta$-$Ga_2O_3$ single crystal; a $Al_xGa_{1-x}N$ buffer layer 42 ($0\leq x\leq 1$) formed on the $Ga_2O_3$ substrate 41; a n-GaN layer 43 formed on the $Al_xGa_{1-x}N$ buffer layer 42; a p-GaN layer 44 formed on part of the n-GaN layer 43; a n-electrode 46 formed on the n-GaN layer 43; and a p-electrode 52 formed on the p-GaN layer 44. The light emitting element 40 is flip-chip bonded through solder balls 63, 64 beneath the p-electrode 52 and n-electrode 46 to lead frames 65, 66.

The light emitting element 40 emits light at the pn-junction interface where the n-GaN layer 43 and p-GaN layer 44 are bonded. Emitted light is output, as output light 60, upward transmitting through the $Ga_2O_3$ substrate 41.

EXAMPLE 4

Double-Heterostructure Light Emitting Element

Figure 11:
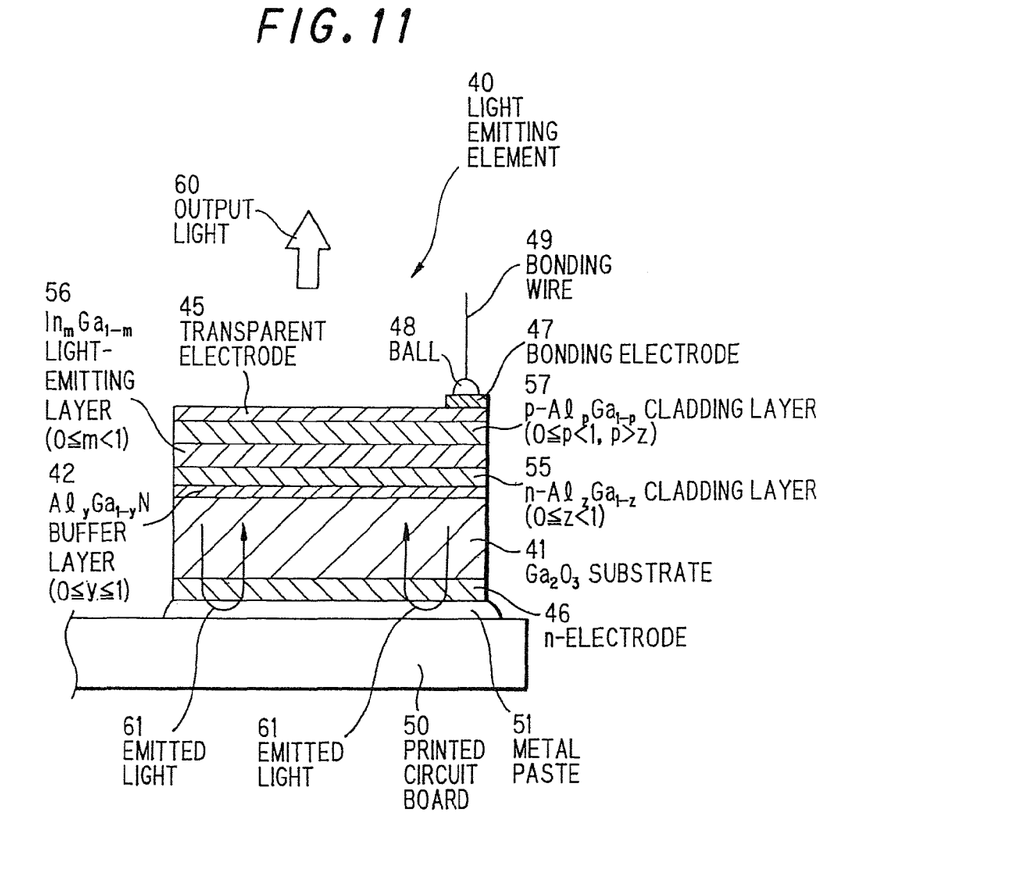
FIG. 11 is a cross sectional view showing a fourth example of light emitting element according to the invention.

FIG. 11 shows a double-heterostructure light emitting element. The light emitting element 40 includes: a $Ga_2O_3$ substrate 41 of $\beta$-$Ga_2O_3$ single crystal; a $Al_yGa_{1-y}N$ buffer layer 42 ($0\leq y\leq 1$) formed on the $Ga_2O_3$ substrate 41; a n-$Al_zGa_{1-z}N$ cladding layer 55 ($0\leq z<1$) formed on the $Al_yGa_{1-y}N$ buffer layer 42; a $In_mGa_{1-m}N$ light-emitting layer 56 ($0\leq m<1$) formed on the n-$Al_zGa_{1-z}N$ cladding layer 55; a p-$Al_pGa_{1-p}N$ cladding layer 57 ($0\leq p<1$, $p>Z$) formed on the $In_mGa_{1-m}N$ light-emitting layer 56; a transparent electrode 45 formed on the p-$Al_pGa_{1-p}N$ cladding layer 57; a Au bonding electrode 47 formed on part of the transparent electrode 45; and a n-electrode 46 formed on the bottom surface of the $Ga_2O_3$ substrate 41. The light emitting element 40 is mounted on the printed circuit board 50 through a metal paste 51 and a bonding wire 49 is bonded to the bonding electrode 47 while forming a ball 48.

The bandgap energy of the n-$Al_zGa_{1-z}N$ cladding layer 55 is greater than that of the $In_mGa_{1-m}N$ light-emitting layer 56, and the bandgap energy of the p-$Al_pGa_{1-p}N$ cladding layer 57 is greater than that of the $In_mGa_{1-m}N$ light-emitting layer 56.

The light emitting element 40 has the double-heterostructure where electron and hole as carriers are confined in the $In_mGa_{1-m}N$ light-emitting layer 56 to increase the probability of recombination therebetween. Therefore, the light emission efficiency can be remarkably enhanced.

Furthermore, emitted light is output such that part of emitted light is output, as output light 60, upward through the transparent electrode 45 and another part is first directed to the bottom of the $Ga_2O_3$ substrate 41, transmitting through the substrate 41, then being outputted upward after being reflected by the metal paste 51. Thus, the light emission intensity of is increased comparing the case that emitted light is directly output.

<Advantages of the Invention>

(1) According to the invention, a light emitting element and a method of making the same that use the transparent and conductive substrate of bulk $\beta$-$Ga_2O_3$ single crystal can be provided. The light emitting element can be equipped with electrodes formed on the top and bottom and, therefore, the structure can be simplified to enhance the manufacturing efficiency. Also, the efficiency of light outputted can be enhanced.

(2) Due to employing the β-$Ga_2O_3$ system material, the substrate can be colorless, transparent and conductive. It can transmit visible light to ultraviolet light. The light emitting element made by using the substrate can have the vertical structure. Also, emitted light can be outputted from the substrate side.

(3) Furthermore, the β-$Ga_2O_3$ single crystal substrate has a processability better than a substrate of conventional materials, i.e., sapphire and SiC.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed

1. A light emitting element, comprising:
a $Ga_2O_3$ system single crystal substrate; and
a pn-junction formed on the substrate,
wherein the pn-junction comprises a first GaN system compound semiconductor thin film of a first conductivity type formed on the substrate of the first conductivity type and a second GaN system compound semiconductor thin film of a second conductivity type formed on the GaN system compound semiconductor thin film, the second conductivity type being opposite to the first conductivity type, and
wherein the substrate is transmissive to light of visible to ultraviolet region.

2. The light emitting element according to claim 1, wherein the first GaN system compound semiconductor thin film of the first conductivity type comprises a GaN system compound semiconductor thin film of the first conductivity type having a first predetermined bandgap energy and a GaN system compound semiconductor thin film of the first conductivity type having a second predetermined bandgap energy smaller than the first predetermined bandgap energy, and the second GaN system compound semiconductor thin film of the second conductivity type has a third predetermined bandgap energy.

3. The light emitting element according to claim 1, wherein the $Ga_2O_3$ system single crystal substrate comprises $(Al_x In_y Ga_{(1-x-y)})_2O_3$, where $0<x<1$, $0\leq y<1$, and $0<x+y<1$.

4. The light emitting element according to claim 2, wherein the $Ga_2O_3$ system single crystal substrate comprises $(Al_x In_y Ga_{(1-x-y)})_2O_3$, where $0<x<1$, $0\leq y<1$, and $0<x+y<1$.

* * * * *